(12) United States Patent
Landru et al.

(10) Patent No.: US 8,497,190 B2
(45) Date of Patent: Jul. 30, 2013

(54) PROCESS FOR TREATING A SEMICONDUCTOR-ON-INSULATOR STRUCTURE

(75) Inventors: Didier Landru, Champ Pres Froges (FR); Gregory Riou, Crolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/314,086

(22) Filed: Dec. 7, 2011

(65) Prior Publication Data

US 2012/0231636 A1 Sep. 13, 2012

(30) Foreign Application Priority Data

Mar. 8, 2011 (FR) ...................................... 11 51884

(51) Int. Cl.
*H01L 21/2532* (2006.01)
*H01L 21/262* (2006.01)
*H01L 21/3105* (2006.01)
*C23C 16/24* (2006.01)

(52) U.S. Cl.
USPC ........... 438/479; 438/478; 438/764; 438/765; 438/775; 438/778; 257/E21.023

(58) Field of Classification Search
USPC ...................... 438/591, 197, 775, 3
See application file for complete search history.

(56) References Cited

U.S. PATENT DOCUMENTS

| | | | | |
|---|---|---|---|---|
| 5,691,231 A | 11/1997 | Kobayashi et al. | | 437/62 |
| 5,780,346 A * | 7/1998 | Arghavani et al. | | 438/296 |
| 6,300,218 B1 | 10/2001 | Cohen et al. | | 438/423 |
| 6,846,727 B2 | 1/2005 | Fogel et al. | | 438/479 |
| 6,924,536 B2 * | 8/2005 | Nishiyama et al. | | 257/411 |
| 6,955,971 B2 | 10/2005 | Ghyselen et al. | | 438/406 |
| 7,052,964 B2 * | 5/2006 | Yeo et al. | | 438/296 |
| 7,112,849 B2 * | 9/2006 | Ahn et al. | | 257/347 |
| 7,183,172 B2 * | 2/2007 | Lee et al. | | 438/407 |
| 7,432,216 B2 * | 10/2008 | Shimamoto et al. | | 438/769 |

(Continued)

FOREIGN PATENT DOCUMENTS

| | | |
|---|---|---|
| FR | 2 847 007 | 5/2004 |
| FR | 2 937 794 | 4/2010 |

(Continued)

OTHER PUBLICATIONS

International Search Report and Written Opinion, PCT/IB2007/051435, mailed Sep. 26, 2007.

(Continued)

*Primary Examiner* — Seahvosh Nikmanesh
*Assistant Examiner* — Evren Seven
(74) *Attorney, Agent, or Firm* — Winston & Strawn LLP

(57) ABSTRACT

A process for treating a semiconductor-on-insulator structure that has, in succession, a support substrate, a layer of an oxide or oxynitride of a semiconductor material, and a thin semiconductor layer of the semiconductor material. The process includes providing, on the surface of the thin layer, a mask defining exposed regions of the thin layer; providing a layer of nitride or oxynitride of the semiconductor material on the exposed regions of the thin layer; and applying a heat treatment causing at least some of the oxygen in the oxide or oxynitride layer to diffuse through the exposed regions. The nitride or oxynitride layer is provided at a thickness sufficient to provide a ratio of the rate of oxygen diffusion though the exposed regions to that through the regions covered with the mask that is greater than 2.

21 Claims, 2 Drawing Sheets

U.S. PATENT DOCUMENTS

| | | | | |
|---|---|---|---|---|
| 7,510,927 | B2 * | 3/2009 | Bohr et al. | 438/225 |
| 7,566,629 | B2 * | 7/2009 | Booth et al. | 438/423 |
| 7,632,735 | B2 * | 12/2009 | Nakai | 438/407 |
| 7,833,891 | B2 * | 11/2010 | Cheng et al. | 438/591 |
| 8,030,173 | B2 * | 10/2011 | Turner et al. | 438/435 |
| 8,283,217 | B2 * | 10/2012 | Guo et al. | 438/151 |
| 8,324,072 | B2 * | 12/2012 | Veytizou et al. | 438/405 |
| 2004/0038495 | A1 * | 2/2004 | Wieczorek et al. | 438/431 |
| 2004/0091377 | A1 | 5/2004 | Uryu et al. | 417/470 |
| 2005/0118789 | A1 | 6/2005 | Aga et al. | 438/459 |
| 2006/0001095 | A1 * | 1/2006 | Doris et al. | 257/348 |
| 2006/0051945 | A1 | 3/2006 | Yokokawa et al. | 438/526 |
| 2006/0154442 | A1 | 7/2006 | De Souza et al. | 438/455 |
| 2007/0128742 | A1 * | 6/2007 | Lee et al. | 438/17 |
| 2008/0102603 | A1 | 5/2008 | Kobayashi et al. | 438/459 |
| 2009/0031911 | A1 | 2/2009 | Kellett et al. | 102/276 |
| 2010/0151663 | A1 * | 6/2010 | Ohnuma et al. | 438/479 |
| 2011/0193201 | A1 | 8/2011 | Kononchuk et al. | 257/627 |
| 2012/0231606 | A1 * | 9/2012 | Nguyen et al. | 438/424 |

FOREIGN PATENT DOCUMENTS

| | | |
|---|---|---|
| FR | 2 937 797 | 4/2010 |
| JP | 2000/036445 | 2/2000 |
| JP | 2006/049725 | 2/2006 |
| WO | WO 2008/114099 | 9/2008 |
| WO | WO 2010/034696 | 4/2010 |

OTHER PUBLICATIONS

French Search Report, FR 1151884, mailed May 17, 2011.

Ahn et al., "Stability of Interfacial Oxide Layers During Silicon Wafer Bonding", J. Appl. Physics, No. 65, vol. 2, pp. 561-563, (1989).

Kononchuk et al., "Internal Dissolution of Buried Oxide in SOI Wafers", Solid State Phenomena, vols. 131-133, pp. 113-118 (2008).

Kononchuk et al., "Novel Trends in SOI Technology for CMOS Applications", Solid State Phenomena, vols. 156-158 pp. 69-76(2010).

Ludsteck et al. "Growth model for thin oxides and oxide optimization", Journal of Applied Physics, vol. 95, No. 5, pp. 2827-2831 (2004).

Misiuk, XP004414254, "Effect of High Temperature- Pressure on SOI Structure", Crystal Engineering, vol. 5, Nos. 3-4, pp. 155-161 (2002).

Sullivan et al., "High Temperature Oxygen Out-Diffusion From the Interfacial SiOx Bond Layer in Direct Silicon Bonded (DSB) Substrates", IEEE 2006 International SOI Conference, Niagara Falls; NY, Silicon Genesis Corp., California (2006).

* cited by examiner

PROCESS FOR TREATING A SEMICONDUCTOR-ON-INSULATOR STRUCTURE

FIELD OF THE INVENTION

The present invention relates to a process for treating a semiconductor-on-insulator (SeOI) structure comprising in succession a support substrate, a layer of an oxide or oxynitride of a semiconductor, and a thin semiconductor layer of the semiconductor, in which a heat treatment is applied in a reduced oxygen atmosphere, and under controlled temperature and time conditions, so as to cause at least some of the oxygen in the oxide or oxynitride layer to diffuse through the thin semiconductor layer, thereby leading to the complete or partial dissolution or disappearance of the buried oxide or oxynitride layer.

BACKGROUND OF THE INVENTION

The heat treatment mentioned above may advantageously be applied locally so as to dissolve—partially or completely—the oxide or oxynitride layer in defined regions of the SeOI structure, corresponding to a desired pattern, while preserving the initial oxide or oxynitride layer in other regions. This is then referred to as "local dissolution" of the oxide or oxynitride layer.

The expression "oxynitride" is understood to mean a compound having the general formula $(Se)O_xN_y$ where Se is the symbol of the semiconductor considered (for example silicon) and where x and y are the non-zero oxygen and nitrogen contents, respectively. The oxide corresponds to the case where $y=0$.

By virtue of such a heat treatment, it is possible to obtain, as illustrated in FIG. 1, an SeOI structure having a variable-thickness oxide or oxynitride layer (in the case of a partial dissolution) or even, as illustrated in FIG. 2, a hybrid structure, i.e., comprising both "SeOI" zones, in which the oxide or oxynitride layer has been preserved, and zones in which this layer has been totally dissolved.

In the case of an oxynitride layer, nitrogen also diffuses through the thin layer of semiconductor, so that after the dissolution treatment, the oxide or oxynitride is transformed into the semiconductor considered.

The SeOI structure of FIG. 1 comprises a support substrate 1, an oxide or oxynitride layer 2 the thickness of which has been locally reduced by the dissolution treatment, and a thin semiconductor layer 3.

The hybrid structure of FIG. 2 comprises a support substrate 1 and a thin semiconductor layer 3, between which the oxide or oxynitride layer 2 has been preserved in certain regions (allowing "SeOI" zones to be formed), and completely dissolved in others (allowing bulk semiconductor zones referenced B to be formed).

Such a structure may be employed to manufacture electronic components (for example "memory" components and logic components) that require different substrates on one and the same wafer.

In other words, it enables the co-integration of circuits that respectively operate on SeOI substrate and on bulk substrate within one and the same chip.

The advantage of local dissolution is therefore to provide a manufacturer of integrated circuits with a wafer comprising "bulk" and "SeOI" zones on which they will be able to fabricate, while preserving their tried and tested technologies, both components requiring a bulk zone and components requiring an SeOI zone.

Specifically, the precision of the local dissolution technique makes it possible to define bulk zones and SeOI zones at the component scale.

Local dissolution is generally implemented by forming a mask on the surface of the thin semiconductor layer and then by applying the heat treatment that promotes the diffusion of the oxygen from the oxide or oxynitride layer towards the surface of the semiconductor layer.

Since the mask is in general made of a material that forms a total or partial barrier to oxygen diffusion, the oxygen can diffuse easily only through the exposed zones of the thin semiconductor layer, i.e. those zones not covered by the mask. In the case where the mask allows partial diffusion of the oxygen, it nevertheless ensures a much lower dissolution rate than that of the exposed (mask-free) zones in which the dissolution is easier because of the absence of mask.

Document WO 2008/114099 describes such a process, in which the mask is obtained by oxidation and completely blocks diffusion. The use of such a mask may have certain drawbacks, however, including the appearance, in the thin semiconductor layer, of trenches at the mask edge. These trenches may have several origins: wetting of the mask by the semiconductor, reaction between the mask and the semiconductor, etc. In every case, it is the high surface mobility of the semiconductor atoms that is responsible for the creation of these trenches. This surface mobility depends on the temperature and the reducing or weakly oxidizing atmosphere of the treatment. These topographical defects, the depth of which may reach the thickness of the semiconductor layer, are detrimental to the fabrication of components on the thin semiconductor layer.

In particular, the mask-edge defects amplify the surface topography variation. This variation makes subsequent circuit fabrication steps difficult to carry out and may lead to dewetting of the semiconductor, i.e., to a loss of cohesion in the thin semiconductor layer, which dissociates so as to form droplets on the surface of the oxide or oxynitride layer.

To remove or minimize these topographical defects, a chemical-mechanical polishing, with the aim of planarizing the surface (so as to prevent level differences related to the sagging of the semiconductor layer), is difficult to implement because it would remove too great a thickness of the semiconductor layer, as the initial thickness of this layer is already chosen to be small so as to facilitate oxygen diffusion. Furthermore, the polishing tends to reduce the thickness uniformity of the semiconductor layer.

A process for locally dissolving the oxide or oxynitride layer which does not have the aforementioned drawbacks is therefore sought. One aim of the invention is thus to provide a local-dissolution process after which the surface topography of the thin semiconductor layer is improved.

SUMMARY OF THE INVENTION

In accordance with the invention, a process is provided for treating a semiconductor-on-insulator structure comprising in succession a support substrate, a layer of the oxide or oxynitride of a semiconductor material, and a thin semiconductor layer of the semiconductor material. In one embodiment, the process comprises masking the surface of the thin layer to provide exposed regions and mask covered regions; applying a heat treatment to the structure in an inert or reducing atmosphere, and under controlled temperature and time conditions, so as to cause at least some oxygen in the insulating layer to diffuse through the exposed regions to thus reduce the thickness of the insulating layer beneath the exposed regions and form an insulating layer of variable or discontinuous thickness.

This is advantageously achieved by providing, either before or during the application of the heat treatment, a surface layer of a nitride or oxynitride of the semiconductor material of the thin layer on the exposed regions and at a thickness sufficient to allow a faster rate of oxygen diffusion through the exposed regions than through the mask covered regions. Preferably, the thickness of the nitride or oxynitride surface layer on the exposed regions is sufficient to provide a ratio of the rate of oxygen diffusion though the exposed regions to the rate of oxygen diffusion through the mask covered regions that is greater than or equal to 2. Also, the mask comprises a material that provides a total barrier to oxygen diffusion from the insulating layer such that the resulting insulating layer has a discontinuous thickness.

In a more specific embodiment, the process comprises:

(i) forming, on the surface of the thin layer, a mask so as to define exposed regions of the thin layer that are not covered by the mask distributed according to a first pattern, and regions covered by the mask distributed according to a second pattern that is complementary to the first; and (ii) applying a heat treatment in an inert or reducing atmosphere, and under controlled temperature and time conditions, so as to cause at least some of the oxygen in the oxide or oxynitride layer to diffuse through the exposed regions of the thin semiconductor layer, leading to a reduction in the thickness of the oxide or oxynitride in regions of the oxide or oxynitride layer arranged according to said first pattern.

The process includes forming, either before or during step (ii), a layer of the nitride or oxynitride of the semiconductor of the thin layer on the exposed regions, with the thickness of the nitride or oxynitride layer being such that the ratio of the rate of oxygen diffusion though the exposed regions of the thin layer to the rate of oxygen diffusion through the regions covered with the mask is greater than or equal to 2.

According to another implementation of the invention, the forming of the surface layer of nitride or oxynitride of the semiconductor material of the thin layer is carried out before the heat treatment of step (ii) is applied.

Alternatively, the step of forming the surface layer of nitride or oxynitride of the semiconductor material of the thin layer on the exposed regions is carried out during at least part of the heal treatment of step (ii).

The layer of the nitride or oxynitride of the semiconductor material of the thin layer may be formed in one of the following ways:

by exposing the exposed regions of the thin layer to a nitrogen-containing atmosphere;

by applying a nitrogen plasma to said thin layer; or by annealing in a nitrogen-containing atmosphere.

According to a variant, the atmosphere of the heat treatment of step (ii) contains nitrogen, such that during step (ii) a layer of the nitride or oxynitride of the semiconductor of the thin layer is formed on the surface of the exposed regions.

Thus, the treatment of step (ii) may be carried out for a time of between 5 and 500 minutes, at a temperature of between 1100 and 1300° C., in an atmosphere that contains nitrogen in a concentration preferably lying between 0.1 and 1%.

BRIEF DESCRIPTION OF THE DRAWINGS

Other features and advantages of the invention will become clear from the detailed description that follows, with reference to the annexed drawings in which.

To facilitate illustration of the embodiments, the different layers have not necessarily been shown to scale.

DETAILED DESCRIPTION OF THE INVENTION

Semiconductor-on-Insulator Structure

Figure 1:
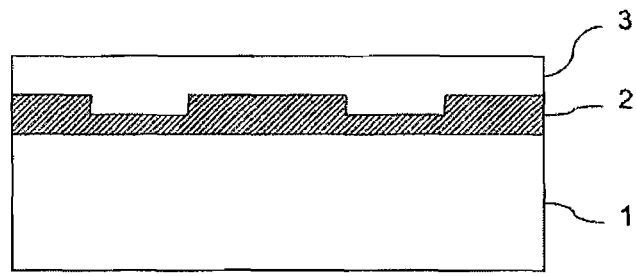
FIG. 1 is a cross-sectional view of a first type of structure obtained by the invention.
Figure 2:
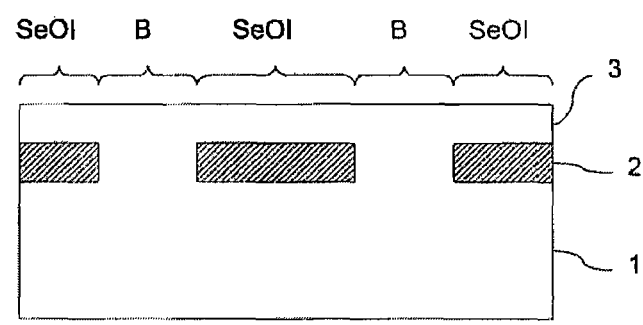
FIG. 2 is a cross-sectional view of a second type of structure obtained by the invention.
Figure 3:
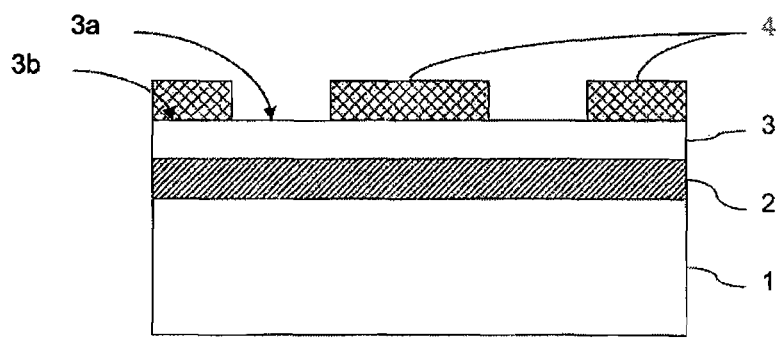
FIG. 3 illustrates a first embodiment of the mask on the thin semiconductor layer according to a defined pattern.

With reference to FIG. 3, the dissolution treatment is applied to a semiconductor-on-insulator structure (SeOI) comprising, in succession from its base to its surface: a support substrate 1; a semiconductor oxide or oxynitride layer 2; and a semiconductor layer 3 which has been covered beforehand with a localized mask.

The support substrate 1 essentially provides rigidity to the SeOI structure.

For this purpose, it typically has a thickness of about a few hundred microns.

The support substrate may be a bulk substrate or else a composite substrate, i.e. consisting of a multilayer of at least two layers of different materials.

The support substrate may thus comprise one of the following materials: Si, GaN or sapphire, in their single-crystal or polycrystalline forms.

The semiconductor layer 3 comprises at least one semiconductor, such as Si, Ge or SiGe.

The semiconductor layer 3 may optionally be a composite, i.e. it may consist of a multilayer structure of multiple semiconductor material layers.

The material of the semiconductor layer may be single-crystal, or polycrystalline amorphous. It may be porous or non-porous, doped or undoped.

It is particularly advantageous for the semiconductor layer to be suitable for receiving electronic components.

The thin semiconductor layer has a thickness of between 5 and 200 nm, preferably between 30 and 100 nm, so as to enable sufficiently rapid diffusion of the oxygen.

The oxide or oxynitride layer 2 is buried in the structure, between the support substrate 1 and the semiconductor layer 3; it is therefore generally referred to, in the parlance of the art, by the acronym BOX (buried oxide).

The layer 2 is formed from the oxide or oxynitride of the semiconductor that forms the thin layer 3, so that decomposition of said nitride or oxynitride in the thin layer can take place.

In order to limit the duration of the dissolution treatment, the oxide or oxynitride layer of the SeOI structure is in general thin or ultrathin, i.e. its thickness is between 5 and 100 nm, preferably between 10 and 25 nm. It typically has a relatively uniform thickness.

The SeOI structure is fabricated by any layer transfer technique known to a person skilled in the art that involves bonding.

Among these techniques, mention may be made of the SmartCut™ process, which mainly comprises the following steps:

i) forming an oxide or oxynitride layer on the support substrate or on a donor substrate comprising the semiconductor layer;

ii) forming a weakened zone in the donor substrate, the weakened zone defining the thin semiconductor layer to be transferred;

iii) bonding the donor substrate to the support substrate, the oxide or oxynitride layer being located at the bonding interface; and iv) fracturing the donor substrate along the weakened zone so as to transfer the thin semiconductor layer to the support substrate.

The process is known to those skilled in the art and will therefore not be described in detail here. The reader is referred, for example, to "Silicon-On-Insulator Technology: Materials to VLSI", 2nd Edition by Jean-Pierre Colinge, Kluwer Academic Publishers, pages. 50-51.

It is also possible to employ a process that involves bonding a donor substrate, comprising the semiconductor layer, to the support substrate, one and/or the other of the substrates being covered with an oxide or oxynitride layer, and then reducing the thickness of the donor substrate via its back side so as to leave, on the support substrate, only the thin semiconductor layer.

The SeOI structure thus obtained may then be subjected to conventional finishing treatments (polishing, planarizing or CMP, cleaning, etc.).

In these processes for forming the SeOI structure, the oxide layer is formed on the donor substrate or on the support substrate by thermal oxidation (in which case the oxide is an oxide of the substrate material that has undergone the oxidation) or else by deposition, for example deposition of silicon oxide ($SiO_2$).

The oxide layer may also be a native oxide layer, resulting from natural oxidation of the donor substrate and/or of the support substrate in contact with the atmosphere.

Any suitable process may be used to form an oxynitride layer, such as for example oxynitride deposition, oxidation followed by nitriding, or else exposing an oxide to a nitrogen plasma.

In contrast, tests carried out on SOI structures obtained by the SIMOX process did not allow dissolution of the oxide to be observed, this being attributed to a lower oxide quality due to the way in which it was obtained. The reader may refer in this respect to the article by L. Zhong et al., Applied Physics Letters 67, 3951 (1995).

It is specified that before the bonding is carried out, it is possible to implement, on one and/or the other of the contact surfaces, cleaning or plasma-activation steps well known to those skilled in the art, so as to increase the bonding energy.

In the rest of the description, the application of the dissolution treatment to a structure in which the thin semiconductor layer 3 is made of silicon, i.e. a silicon-on-insulator (SOI) structure, will be taken as an example.

Mask Formation

As illustrated in FIG. 3, a mask 4 is formed on the surface of the thin layer 3 so as to cover regions 3b of the surface through which the oxygen must not diffuse, or at least must have a diffusion rate very much lower than that of the exposed regions 3a.

The regions 3a of the surface of the thin layer 3 not covered by the mask 4 are called "exposed" regions.

These regions 3a—which must allow easy diffusion of oxygen and, if required, nitrogen—of the oxide or oxynitride layer 2 are distributed according to the pattern in which it is desired to dissolve all or part of the thickness of the oxide or oxynitride layer.

In other words, the mask 4 is distributed over the thin layer 3 according to a pattern complementary to the pattern in which it is desired to dissolve all or part of the thickness of the oxide or oxynitride layer.

To this end, the mask is made of a material that forms a partial or complete barrier to the oxygen coming from the substrate.

The mask may be formed, for example but not exclusively, according to one of the processes described in documents WO 2008/114099 and WO 2010/034696.

Thus, according to a first embodiment, the mask is produced by local deposition of a nitride or oxide on the surface of the thin layer 3.

Figure 5:
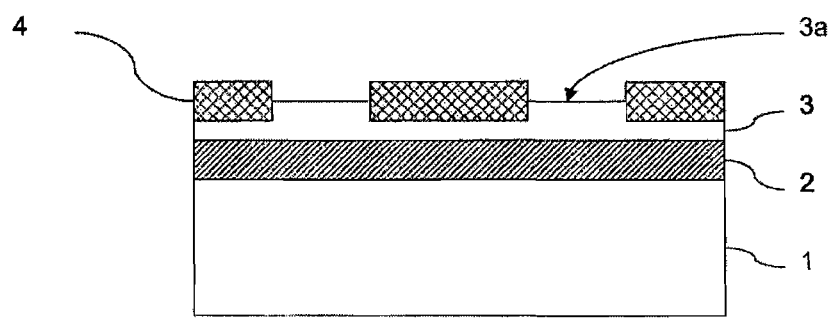
FIG. 5 illustrates a second embodiment of the mask on the thin semiconductor layer according to a defined pattern.

According to a second embodiment, illustrated in FIG. 5, the mask is formed by thermal oxidation of zones of the thin layer 3b, the zones 3a intended to form the exposed zones being protected from such oxidation.

Relative to the preceding embodiment, the formation of such a mask involves a small thickness of the thin layer 3 being consumed, leading to the mask being partially "buried" in the thin layer 3.

According to a third embodiment (not illustrated here), the mask consists of regions of the thin layer 3 which are thicker than the regions through which the oxygen, and if required nitrogen, atoms must diffuse from the buried oxide or oxynitride layer.

Treatment of the Exposed Regions

Figure 4:
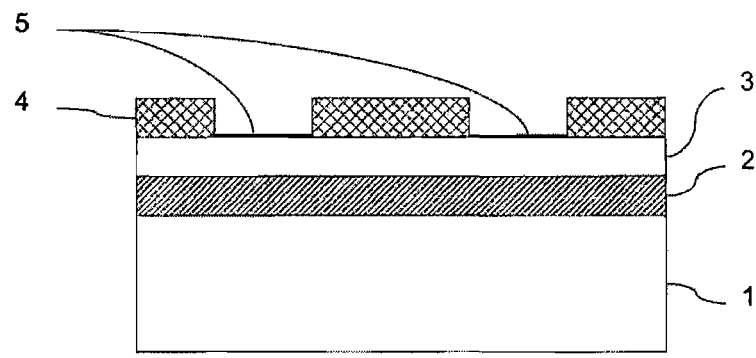
FIG. 4 illustrates the formation of a nitride or oxynitride layer on the exposed zones of the thin semiconductor layer of the structure in FIG. 3.
Figure 6:
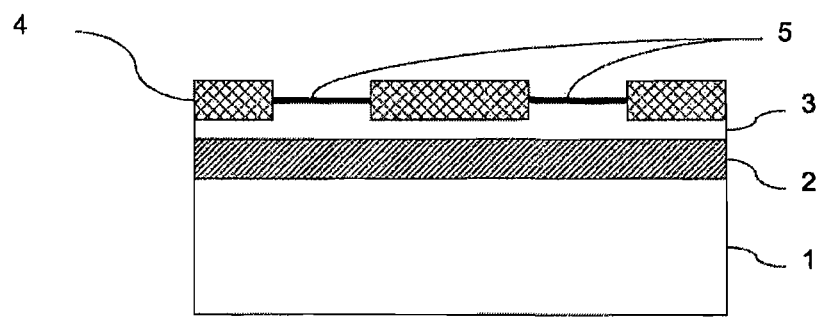
FIG. 6 illustrates the formation of a nitride or oxynitride layer on the exposed zones of the thin semiconductor layer of the structure in FIG. 5.

With reference to FIG. 4, or if appropriate to FIG. 6, after the mask 4 has been formed, a treatment is applied to the exposed regions 3a of the thin layer 3, the treatment aiming to form, on the surface of such regions 3a, a thin layer 5 of the nitride or oxynitride of the semiconductor of the layer 3.

According to a first embodiment, the treatment is carried out before the dissolution heat treatment is implemented.

The treatment may comprise applying a nitrogen plasma.

By way of example, an $N_2$ RIE (reactive ion etching) plasma is applied for 30 seconds at 500 W and a pressure of 50 mTorr.

Alternatively, the treatment may comprise a nitrogen anneal.

For example, said nitrogen anneal is carried out at 1000° C. in an atmosphere containing 99% argon and 1% nitrogen, for ½ an hour.

According to a second embodiment, the treatment of the exposed zones is implemented during the dissolution heat treatment.

For this purpose, nitrogen is introduced into the inert or reducing atmosphere of the dissolution treatment during all or part of the heat treatment.

The nitrogen concentration typically lies between 0.1 and 1%.

For example, the dissolution heat treatment is carried in an argon atmosphere comprising from 0.1% to 1% nitrogen, for 1 hour and at a temperature of between 1100 and 1300° C.

The nitrogen concentration varies as a function of the temperature: the higher the temperature, the higher the concentration.

The thickness of the nitride or oxynitride layer 5 thus formed on the surface of the exposed regions 3a is typically between 1 and 10 nm.

This makes it possible to obtain a ratio of the oxygen diffusion rate through the exposed regions 3a to the oxygen diffusion rate through the regions 3b covered by the mask 4 greater than or equal to 2.

Dissolution Heat Treatment

For the heat treatment, the SOI structure is placed in a furnace in which a gas flow is generated so as to form an inert or reducing atmosphere.

The gas flow may thus comprise argon, hydrogen and/or a mixture of these gases, and if required, nitrogen.

It is important to note that the buried layer only dissolves when there is a sufficient gradient between the oxygen concentration in the atmosphere and the oxygen concentration at the surface of the oxide or oxynitride layer, i.e., when the oxygen content of the atmosphere is sufficiently low. Thus, it is considered that the oxygen content of the atmosphere in the furnace must be lower than a certain suitable threshold, for example about 10 ppm, which, when leaks are taken into account, implies that the gas flow must have an oxygen content lower than 1 ppb. In this respect reference may be made to the article by Ludsteck et al. "Growth model for thin oxides and oxide optimization", Journal of Applied Physics, Vol. 95, No. 5, March 2004.

These conditions cannot be obtained in a conventional furnace, which generates too many leaks to allow such a low oxygen content to be achieved—the furnace must be specially designed for optimal leak-tightness (reduction in the number of parts so as to avoid joins, use of integral parts, etc.)

In contrast, too high an oxygen concentration in the atmosphere, above the aforementioned threshold, for example about 10 ppm, stops the dissolution and promotes oxidation of the exposed silicon.

The mechanisms of the dissolution of the oxide in an SOI structure are described in detail in the article by O. Kononchuk et al., "Internal Dissolution of Buried Oxide in SOI Wafers", Solid State Phenomena, Vols. 131-133 (2008), pp 113-118, to which the reader may refer.

Under the effect of the heat treatment, the oxygen atoms—and, if appropriate, the nitrogen atoms—of the oxide or oxynitride layer diffuse through the thin layer 3 into the regions covered by the nitride or oxynitride layer 5.

The layer 5 is sufficiently thin that, even if it slows the diffusion, it allows a faster diffusion than is possible through the mask 4.

It is considered that, for the dissolution to be satisfactory, the ratio of the diffusion rate through the regions covered by the layer 5 to the rate through the regions covered by the mask 4 must be greater than about 2.

In the exposed zones, the reduction in the dissolution rate due to the presence of the layer 5 in particular depends on the material of the latter and its thickness.

The rate of oxygen diffusion through the surface layer is calculated from the dissolution rate of the buried oxynitride layer. The dissolution model is known and calibrated.

When a person skilled in the art modifies the chemical nature of the surface, he is able to determine the effect of this layer on the oxygen diffusion by measuring the difference between the observed dissolution rate and that expected in the absence of any modification.

Moreover, the layer 5 reduces the surface mobility of the silicon atoms or of the semiconductor of the thin layer 3.

Thus, the topographical defects, the formation of trenches and the dewetting mentioned above in the introduction are prevented or at least greatly reduced.

Thus, to dissolve an oxide of 2 nm in thickness under a thin layer of silicon of 100 nm in thickness, the conditions of the heat treatment are: 1100° C. for 2 hours, 1200° C. for 10 minutes, or 1250° C. for 4 minutes.

It will be noted however that these values depend in particular on the residual oxygen concentration in the dissolution furnace and on the nature of the layer 5. Thus, larger dissolved thicknesses have also been observed.

After the dissolution treatment, the mask 4 and the nitride or oxynitride layer 5 are removed by any appropriate means, such as etching.

Thus, even through forming the layer 5 may increase the surface roughness of the semiconductor layer 3, it is possible to remedy this roughness via a chemical etch, for example.

Finally, a planarization step is generally necessary to provide the thin layer 3 with a planar surface and satisfactory roughness. For this purpose any appropriate method may be employed (polishing, chemical thinning, etc.).

What is claimed is:

1. A process for providing an insulating layer of variable or discontinuous thickness in a semiconductor-on-insulator structure that initially includes, in succession a support substrate, an insulating layer of an oxide or oxynitride of a semiconductor material, and a thin semiconductor layer of the semiconductor material, wherein the process comprises:
    masking the surface of the thin layer to provide exposed regions and mask covered regions;
    applying a heat treatment to the structure in an inert or reducing atmosphere, and under controlled temperature and time conditions, so as to cause at least some oxygen in the insulating layer to diffuse through the exposed regions to thus reduce the thickness of the insulating layer beneath the exposed regions and form an insulating layer of non-uniform thickness; and
    before or during the application of the heat treatment, providing a surface layer of a nitride or oxynitride of the semiconductor material of the thin layer only on the exposed regions and at a thickness sufficient to slow down the rate of oxygen diffusion through the exposed regions while providing a faster rate of oxygen diffusion through the surface layer protected exposed regions than through the mask covered regions.

2. The process of claim 1, wherein the mask comprises a material that provides a total barrier to oxygen diffusion from the insulating layer and the resulting insulating layer after the heat treatment has a discontinuous thickness.

3. The process of claim 1, wherein the thickness of the nitride or oxynitride surface layer on the exposed regions is sufficient to provide a ratio of the rate of oxygen diffusion though the exposed regions to the rate of oxygen diffusion through the mask covered regions that is greater than or equal to 2.

4. The process of claim 1, wherein the surface layer of the nitride or oxynitride is provided before the heat treatment is applied.

5. The process of claim 4, wherein the surface layer of the nitride or oxynitride is formed by exposing the exposed regions of the thin layer to a nitrogen-containing atmosphere.

6. The process of claim 4, wherein the surface layer of the nitride or oxynitride is formed by applying a nitrogen plasma to at least the exposed regions of the thin layer.

7. The process of claim 6, wherein the surface layer of the nitride or oxynitride is formed by annealing the structure in a nitrogen-containing atmosphere.

8. The process of claim 1, wherein the surface layer of the nitride or oxynitride is provided during the application of at least part of the heat treatment.

9. The process of claim 8, wherein the atmosphere of the heat treatment contains nitrogen, such that during the application of the heat treatment, the surface layer of the nitride or oxynitride is formed on the exposed regions.

10. The process of claim 1, wherein the application of the heat treatment is carried out for a time of between 5 and 500 minutes, at a temperature of between 1100 and 1300° C., and in an atmosphere that contains nitrogen at a concentration of between 0.1 and 1% so that the surface layer is provided during the heat treatment.

11. The process of claim 1 wherein the heat treatment is carried out in a furnace having an atmosphere with an oxygen content which, when leaks are taken into account, is lower than 1 ppb.

12. A process for treating a semiconductor-on-insulator structure comprising in succession a support substrate, a layer of an oxide or oxynitride of a semiconductor, and a thin semiconductor layer of the semiconductor material, wherein the process comprises:
forming, on the surface of the thin layer, a mask that defines exposed regions of the thin layer that are not covered by the mask, distributed according to a first pattern, and regions of the thin layer covered by the mask, distributed according to a second pattern that is complementary to the first pattern;
applying a heat treatment to the structure in an inert or reducing atmosphere, and under controlled temperature and time conditions, so as to cause at least some of the oxygen in the oxide or oxynitride layer to diffuse through the exposed regions of the thin semiconductor layer and to reduce the thickness of the oxide or oxynitride layer beneath the exposed regions arranged in the first pattern; and
before or during the application of the heat treatment, providing a surface layer of a nitride or oxynitride of the semiconductor material of the thin layer only on the exposed regions and at a thickness sufficient to provide a ratio of the rate of oxygen diffusion though the exposed regions of the thin layer to the rate of oxygen diffusion through the regions covered with the mask that is greater than or equal to 2.

13. The process of claim 12, wherein the mask comprises a material that provides a total barrier to oxygen diffusion from the insulating layer and the resulting insulating layer after the heat treatment has a discontinuous thickness.

14. The process of claim 12, wherein the surface layer of the nitride or oxynitride is provided before the heat treatment is applied.

15. The process of claim 12, wherein the surface layer of the nitride or oxynitride is formed by exposing the exposed regions of the thin layer to a nitrogen-containing atmosphere.

16. The process of claim 15, wherein the surface layer of the nitride or oxynitride is formed by applying a nitrogen plasma to at least the exposed regions of the thin layer.

17. The process of claim 16, wherein the surface layer of the nitride or oxynitride is formed by annealing the structure in a nitrogen-containing atmosphere.

18. The process of claim 12, wherein the surface layer of the nitride or oxynitride is provided during the application of at least part of the heat treatment.

19. The process of claim 18, wherein the atmosphere of the heat treatment contains nitrogen, such that during the application of the heat treatment the surface layer of the nitride or oxynitride is formed on the exposed regions.

20. The process of claim 19, wherein the application of the heat treatment is carried out for a time of between 5 and 500 minutes, at a temperature of between 1100 and 1300° C., and in an atmosphere that contains nitrogen at a concentration of between 0.1 and 1%.

21. The process of claim 12, wherein the heat treatment is carried out in a furnace having an atmosphere with an oxygen content which, when leaks are taken into account, is lower than 1 ppb.

* * * * *